United States Patent
Moriwaki et al.

(10) Patent No.: US 6,490,715 B1
(45) Date of Patent: Dec. 3, 2002

(54) CELL LIBRARY DATABASE AND DESIGN AIDING SYSTEM

(75) Inventors: Toshiyuki Moriwaki, Osaka (JP); Shiro Sakiyama, Osaka (JP); Hiroo Yamamoto, Osaka (JP); Jun Kajiwara, Kyoto (JP); Masayoshi Kinoshita, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/550,352

(22) Filed: Apr. 14, 2000

(30) Foreign Application Priority Data

Apr. 16, 1999 (JP) .............................. 11-109785

(51) Int. Cl.⁷ ............................................ G06F 17/50
(52) U.S. Cl. .................. 716/17; 716/2; 716/4; 716/6
(58) Field of Search .............................. 716/2, 4, 6, 17; 703/14

(56) References Cited

U.S. PATENT DOCUMENTS 5,838,947 A * 11/1998 Sarin ........................ 703/14

FOREIGN PATENT DOCUMENTS

JP    6-260557    9/1994

* cited by examiner

Primary Examiner—Matthew Smith
Assistant Examiner—Thuan Do
(74) Attorney, Agent, or Firm—Pearne & Gordon LLP (57) ABSTRACT

A cell library database includes function information of standard cells which are basic circuits forming a logical device, each of the standard cell comprising at least one of power supply terminal as logical terminals, the function information of the standard cell containing logical information or delay information of the power supply terminal relative to an output terminal, or function information of macro cells which are functional circuits forming a logical device, each of the macro cell comprising at least one of power supply terminals as logical terminals, the function information of the macro cell containing logical information or delay information of said power supply terminals relative to an output terminal. A design aiding system uses the cell library database to execute logical simulation, etc.

22 Claims, 8 Drawing Sheets

CELL LIBRARY DATABASE AND DESIGN AIDING SYSTEM

BACKGROUND OF THE INVENTION

This invention relates to a cell library database used in computer-aided design (CAD) of logical devices such as semiconductor integrated circuits and a design aiding system using the cell library database. Particularly, the invention relates to a cell library database and a design aiding system appropriate for logical simulation used for design verification of logic, delay, or the like, of logical devices ,failure analysis, software development tools, or the like.

Hitherto, in computer-aided design (CAD) of logical devices such as semiconductor integrated circuits, power consumption has been reduced based on various techniques and concepts with an increase in the importance of low power consumption in chips, systems, apparatus, etc., of LSI, etc.

One of the techniques of reducing power consumption is a design technique of changing a conventional single power supply to multiple power supplies. According to the design technique, in LSI, for example, conventional power supply voltage is used for an interface circuit with the outside and the power supply voltage is decreased for internal circuitry, thereby reducing power consumption. Based on a similar concept, conventional power supply voltage is given to blocks in LSI requiring high-speed performance and lower power supply voltage is given to blocks not requiring high speed, whereby it is also made possible to reduce power consumption of the LSI.

To conduct circuit design of LSI as exemplified above, there is a possibility that the same standard cell may be used under different power supply voltages. Thus, in logical simulation, it is necessary to provide cell library databases corresponding to the power supply voltages even for the cells having the same logic and use the provided cell library databases to verify the design. JP-A-6-260557 discloses a semiconductor design aiding system for verifying design of LSI with multiple power supplies mixed. The contents of the semiconductor design aiding system will be discussed briefly.

The semiconductor design aiding system in the related art is as follows: When a circuit diagram is drawn, the cells having the same logical function are represented by the same symbol mark. Which power supply voltage each cell operates on is indicated in the circuit diagram, whereby when the circuit diagram is expanded to a net list, the cell is converted into a predetermined cell name based on the combination of the corresponding function and operation power supply voltage, whereby the logical information and electrical characteristics of the corresponding logical cell in the cell library database are used to execute logical simulation.

Figure 8:
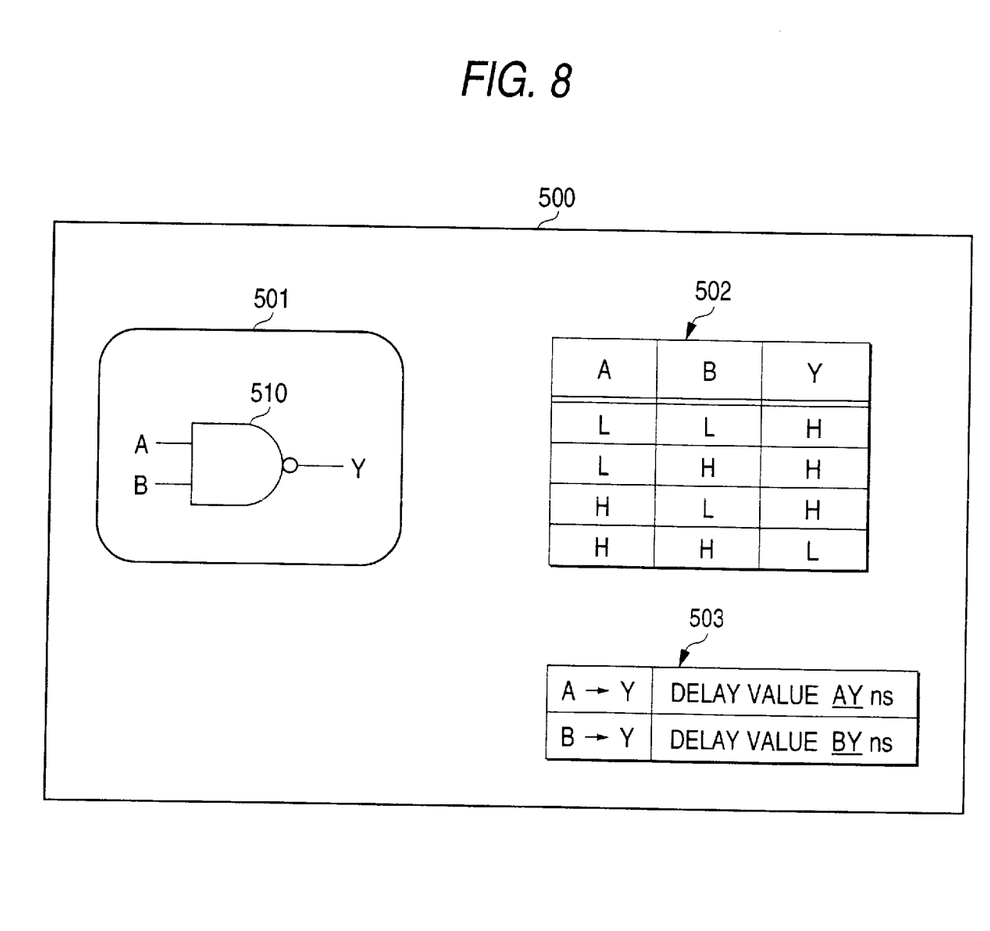
FIG. 8 is a schematic representation of the contents of a cell library database in a related art.

FIG. 8 illustrates the contents of the cell library database used in the related art example. Cell library registration information contains information of a symbol mark 501 of a cell (NAND gate 510), a logical relation table 502 of input signals A and B and an output signal Y, and a delay time table 503 listing the propagation delay times until the output signal C is output after the input signals A and B change.

Another technique aside from the above-described technologies of reducing power consumption is as follows: A control function is provided wherein when the circuit operation is not required, power supply to the corresponding logical block is stopped and when the circuit operation is required, power is supplied to the logical block, whereby fruitless circuit operation is reduced for decreasing the power consumption of the whole circuitry.

With the design aiding system in the related art described above, logical simulation of a semiconductor integrated circuit with multiple power supplies mixed can be executed; however, the logical information and the delay time information are described as registration information in the cell library database based on the premise that power is always supplied, thus if logical simulation is executed for a circuit having a control function of supplying power to logical blocks and stopping power supply to logical blocks as in the third technique of reducing power consumption as described above, all logical blocks always operate. Thus, if the whole circuitry is logically simulated at a time, it is impossible to verify design of the circuit specifications as essentially assumed and the circuit for controlling power supply and power supply stop and the logical blocks must be logically simulated and checked separately. Since logical simulation of the whole circuitry cannot be accomplished in batch, the connection relationship between the logical blocks, etc., is verified by another worker or function simulation or the like; the design verification job becomes intricate.

SUMMARY OF THE INVENTION

It is therefore an object of the invention to provide a cell library database and a design aiding system for making it possible to logically simulate the whole of even a logical device comprising a control function of power supply and power supply stop in batch and consequently execute logical simulation accurately and easily.

To the end, according to first aspect of the invention, there is provided a cell library database having function information of standard cells which are basic circuit forming a logical device, each of the standard cell having at least one of power supply terminal as logical terminal, the function information of the standard cell containing logical information of the power supply terminal relative to an output terminal.

According to second aspect of the invention, there is provided a cell library database having function information of standard cells which are basic circuit forming a logical device, each of the standard cell having at least one of power supply terminal as logical terminal, the function information of the standard cell contains delay information of the power supply terminals relative to an output terminal.

According to third aspect of the invention, there is provided a cell library database having function information of macro cells which are functional circuits forming a logical device, each of the macro cell having at least one of power supply terminal as logical terminals, and the function information of the macro cell containing logical information of the power supply terminal relative to an output terminal.

According to fourth aspect of the invention, there is provided a cell library database having function information of macro cells which are functional circuits forming a logical device, each of the macro cell having at least one of power supply terminal as logical terminals and the function information of the macro cell containing delay information of the power supply terminals relative to an output terminal.

According to fifth aspect of the invention, there is provided a design aiding system using a cell library database as described above for aiding design of logical devices.

In the cell library database, the standard cell comprises one or more power supply terminals as logical terminals and the function information of the standard cell for each type in the cell library database contains the logical information or the delay information of the one or more power supply terminals relative to the output terminal. The design aiding system uses the cell library database to execute logical simulation, or the like.

The standard cell is a basic circuit forming a logical device; for example, it corresponds to a gate element such as a NAND gate or a NOR gate, a flip-flop (latch), or the like. Power supply potential Vcc, ground potential GND, etc., is supplied to the power supply terminal, and different potentials of 5 [V], 3.3 [V], 2.5 [V], 1.8 [V], or the like, are used as the power supply potential Vcc. The logical information of the standard cell corresponds to a logic relation table of the input and power supply terminals to the output terminal, etc., for example. As the handled signal values, the logical values "1", "0", "H", "L", "X" corresponding to "undefined" are used and in addition, "↑" and "↓" are used as transition state signal values if the rising state and the falling state of a signal are significant; "Z" representing a high impedance state in a tristate element also becomes a real signal value. The delay information of the standard cell corresponds to a propagation delay occurring when a signal propagates in the element, an inertia delay determined in association with energy for driving the element, and the like. Further, the logical simulation mentioned here has a wide range of applications of not only design verification of logic, delay, etc., of a logical device, but also failure analysis and software development tools.

Since the standard cell comprises one or more power supply terminals as logical terminals and the function information of the standard cell for each type in the cell library database has the logical information of the one or more power supply terminals relative to the output terminal, the circuit operation difference caused by power supply or power supply stop can be simulated even for a logical device containing a logical block with power supply undergoing switching control. Thus, it is made possible to verify logic design of the whole logical device in batch. Since the function information has the delay information of the one or more power supply terminals relative to the output terminal, it is made possible to execute design verification of delay considering the power supply timing. To sum up, logical simulation of a logical device with multiple power supplies mixed can be executed and in addition, the whole of even a logical device comprising a control function of power supply and power supply stop for reducing power consumption can also be executed in batch; consequently, it is made possible to conduct logical simulation and design aiding accurately and easily.

In the cell library database, the macro cell comprises one or more power supply terminals as logical terminals and the function information of the macro cell for each type in the cell library database contains the logical information or the delay information of the one or more power supply terminals relative to the output terminal. The design aiding system uses the cell library database to execute logical simulation, or the like.

The macro cell is a circuit forming a logical device and having a functional unit; for example, it corresponds to a register, a data selector, a level shifter, an adder, memory, or the like. Power supply potential Vcc, ground potential GND, etc., is supplied to the power supply terminal, and different potentials of 5 [V], 3.3 [V], 2.5 [V], 1.8 [V], etc., are used as the power supply potential Vcc. The logical information of the macro cell corresponds to a logic relation table of the input and power supply terminals to the output terminal, etc., for example. As the handled signal values, the logical values "1," "0," "L," "X," corresponding to "undefined" are used and in addition, "↑" and. "↓" are used as transition state signal values if the rising state and the falling state of a signal are significant; "Z" representing a high impedance state in a tristate element also becomes a real signal value. The delay information of the macro cell corresponds to a propagation delay occurring when a signal propagates in the macro cell, an inertia delay determined in association with drive energy, and the like. Further, the logical simulation mentioned here has a wide range of applications of not only design verification of logic, delay, etc., of a logical device, but also failure analysis and software development tools.

Since the macro cell comprises one or more power supply terminals as logical terminals and the function information of the macro cell for each type in the cell library database has the logical information of the one or more power supply terminals relative to the output terminal, the circuit operation difference caused by power supply or power supply stop can be simulated even for a logical device containing a logical block with power supply undergoing switching control. Thus, it is made possible to verify logic design of the whole logical device in batch. Since the function information has the delay information of the one or more power supply terminals relative to the output terminal, it is made possible to execute design verification of delay considering the power supply timing. To sum up, logical simulation of a logical device with multiple power supplies mixed can be executed and in addition, the whole of even a logical device comprising a control function of power supply and power supply stop for reducing power consumption can also b e executed in batch; consequently, it is made possible to conduct logical simulation and design aiding accurately and easily.

The cell library databases of the first or second aspect of the invention can be used to execute simulation at a gate level, the cell library databases of the third or fourth aspect of the invention can be used to execute simulation at a function level. And the cell library databases of the invention can be used in combination to execute simulation at a gate and function mix level. Further, if the cell library databases of the third or fourth of the invention are applied to high-order modules in a design hierarchy, simulation at a module level can be executed.

The logical devices to which the cell library database and the design aiding system of the invention are applied include not only the semiconductor integrated circuits of IC, LSI, VLSI, ULSI, etc., but also a logical device comprising discrete parts mounted on a board.

DETAILED DESCRIPTION OF THE PREFERRED EMBODIMENTS

Referring now to the accompanying drawings, there are shown preferred embodiments of a cell library database and a design aiding system of the invention.

First Embodiment

Figure 1:
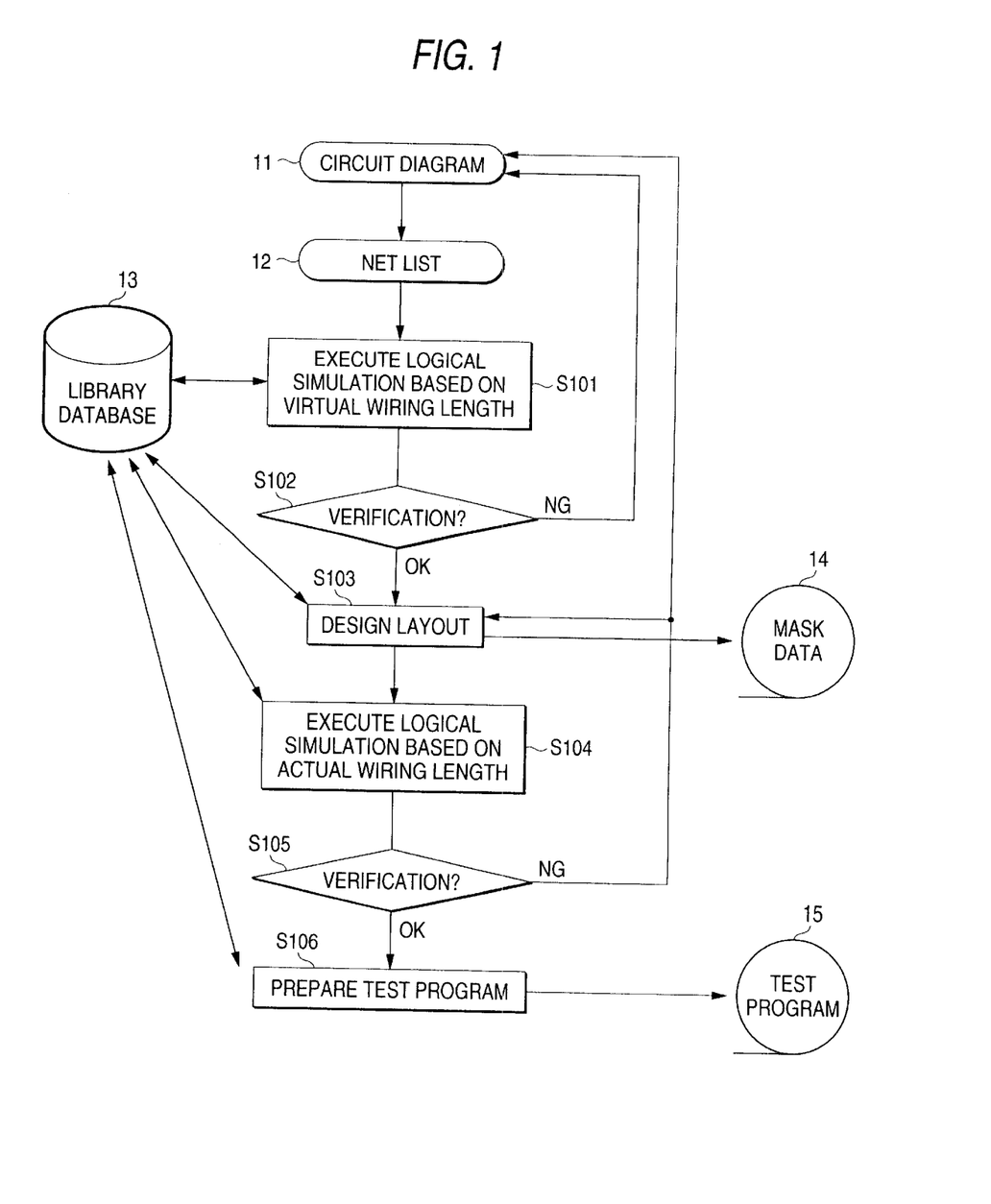
FIG. 1 is a schematic representation of concept to describe the operation in a design aiding system according to a first embodiment of the invention.

FIG. 1 is a schematic representation of concept to describe the operation in a design aiding system according to an embodiment of the invention. The design aiding system of the embodiment aids logical device design mainly by verifying design of logic, delay, etc., of logical devices of semiconductor integrated circuits such as IC, LSI, VLSI, ULSI. Logical simulation can be executed at a gate level, a function level, and a gate and function mix level.

In FIG. 1, a circuit diagram 11 is a circuit diagram where gate elements of NAND gates, NOR gates, etc., flip-flop circuits (latches), etc., provided through logical circuit design are expanded; it may be a circuit diagram containing function elements (macros) of registers, data selectors, level shifters, adders, memory, etc. To prepare the circuit diagram, for example, a CAD workstation for interactively connecting the elements is used for entry. Consequently, what standard cells or macro cells are used and how the cells are connected for providing a desired semiconductor integrated circuit are indicated in the circuit diagram.

Normally, a net list 12 is automatically prepared from the circuit diagram 11 while a cell library database 13 is referenced. The net list 12 is a list of description of "symbol identifier, symbol (function) element name, pin name, signal name, pin name, signal name, . . ." for each symbol name on the circuit diagram. The "pin name-signal name" pairs are described repeatedly as many as the number of pins. The symbol corresponds to a gate element, etc., at the gate level and a function element at the function level.

Next, logical simulation based on a virtual wiring length is executed at step S101. The virtual wiring length registered in the cell library database 13 is converted into resistance and capacitance components and delay calculation is performed, then simulation is executed based on the result. The means for specifically performing the processing is provided by a processing program on the CAD workstation, for example. This also applies to steps S103, S104, and S106 described later.

At step S102, if a desired result is not provided in response to the design verification result of logic, delay, etc., based on the logical simulation at step S101, again the circuit diagram 11 is checked and corrected and expansion to the net list 12 and the logical simulation at step S101 are repeated. If the desired result is provided, control goes to step S103.

The logical simulation at step S101 is executed at the gate level, the function level, or the gate and function mix level in response to the design hierarchy of the given net list 12 (circuit diagram 11). However, the design hierarchy is lowered gradually from the function level to the gate and function mix level to the gate level and expansion to the net list 12 and the logical simulation at step S101 are repeated, whereby logic design can also be conducted by the top down design technique.

If the design verification result of logic, delay, or the like, based on the logical simulation at the gate level at step S101 is as desired, control goes to step S103 at which the gate elements, etc., are placed and element signals are wired for designing a layout while the cell library database 13 is referenced. At step S104 following step S103, logical simulation at the gate level based on the real wiring length is executed. If a desired result is not provided in response to the design verification result of logic, delay, etc., based on the logical simulation at step S104, again the layout (mask data 14) or the circuit diagram 11 is checked and corrected. If the desired result is provided, the prepared master data 14 is used to prepare a mask and a semiconductor integrated circuit is manufactured. Then, a test program 15 is prepared at step S15.

The cell library database 13 stores data required for the expansion processing to the net list 12, the logical simulation at step S101, the layout design at step S103, the logical simulation at step S104, and the test program preparation at step S106. It stores a design rule, etc., for the expansion processing, the virtual wiring length, logical information, delay information for the logical simulation, geometric information of the elements for the layout design, a test rule for the test program preparation, and the like. Since the invention is characterized by the cell library database 13 used in logical simulation, logical information, delay information, and the like will be mainly discussed in detail.

Second Embodiment

Next, a cell library database 13 according to a second embodiment of the invention will be discussed. First, a specific example of a logical device to which the cell library database 13 of the embodiment is applied will be discussed, then logical information, delay information, etc., stored in the cell library database 13 will be discussed in detail.

Figure 2:
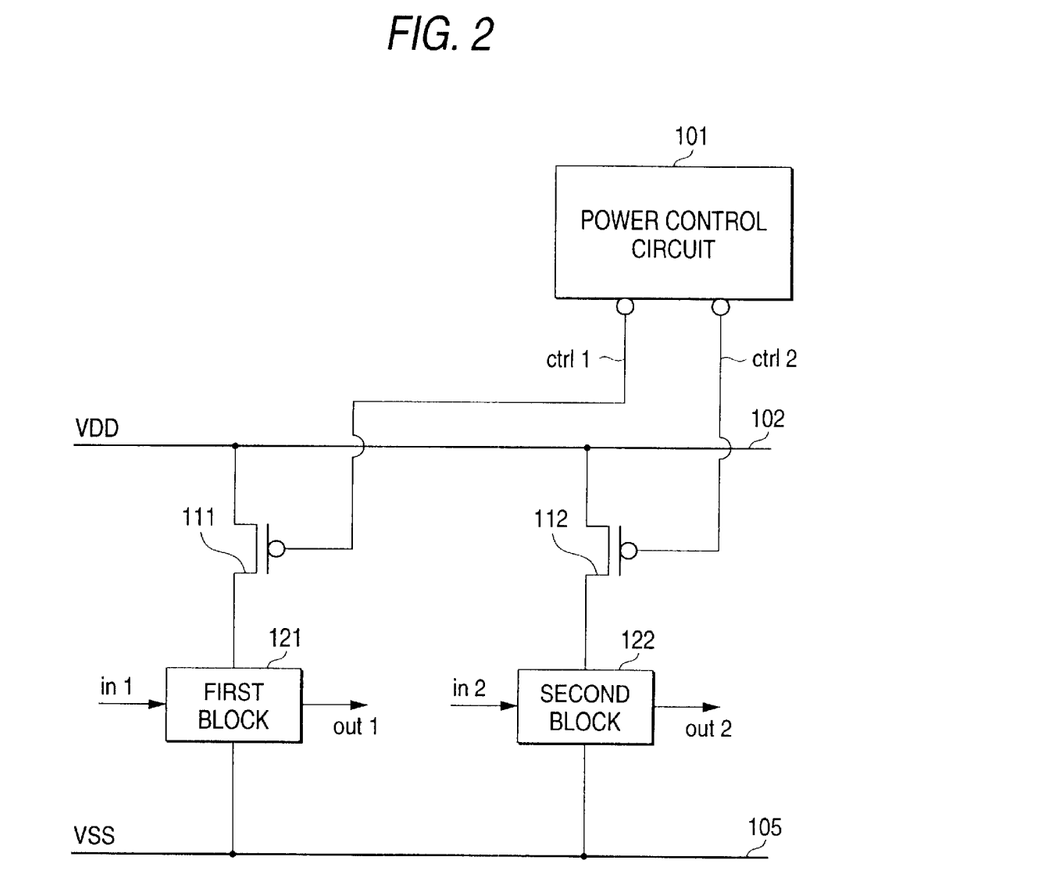
FIG. 2 is a circuit diagram to illustrate the circuit configuration for reducing power consumption.

FIG. 2 illustrates the configuration of a semiconductor integrated circuit intended for low power consumption as a specific example of a logical device to which the cell library database 13 of the embodiment is applied. In the circuit configuration example in FIG. 2, power supply and power supply stop are controlled for each circuit block, whereby low power consumption is intended.

In FIG. 2, numerals 121 and 122 denote first and second logical blocks installed in the semiconductor integrated circuit, numeral 101 denotes a power control circuit for generating control signals ctrl1 and ctrl2 for controlling power supply to the first and second logical blocks 121 and 122, numeral 102 denotes a first power supply (VDD) line, and numeral 105 denotes a second power supply (VSS) line. Numerals 111 and 112 denote power supply control switches for turning on and off power supply to the first and second logical blocks 121 and 122; in the circuit example, p-channel transistors are used.

Next, how power consumption can be reduced will be discussed based on the circuit configuration example. In the description to follow, a low potential is abbreviated as low (L), a high potential is abbreviated as high (H), and an undefined value is abbreviated as X.

For the first logical block 121 to operate, the power supply control switch 11 need to be turned on and the first logical block 121 and the power supply line 102 need to be connected. This means that the control signal ctrl1 generated by the power control circuit 101 needs to be low. Likewise, for the second logical block 122 to operate, the power supply control switch 112 need to be turned on and the second logical block 122 and the power supply line 102 need to be connected. This means that the control signal ctr12 generated by the power control circuit 101 needs to be low. If input signals in1 and in2 to the first and second logical blocks 121 and 122 change in the state, circuits in the first and second logical blocks 121 and 122 operate and power is consumed at this time.

Therefore, to suppress power consumption in the first logical block 121 or the second logical block 122, the power supply control switch 111 or 121 may be turned off for disconnecting the first logical block 121 or the second logical block 122 and the power supply line 102.

Figure 3:
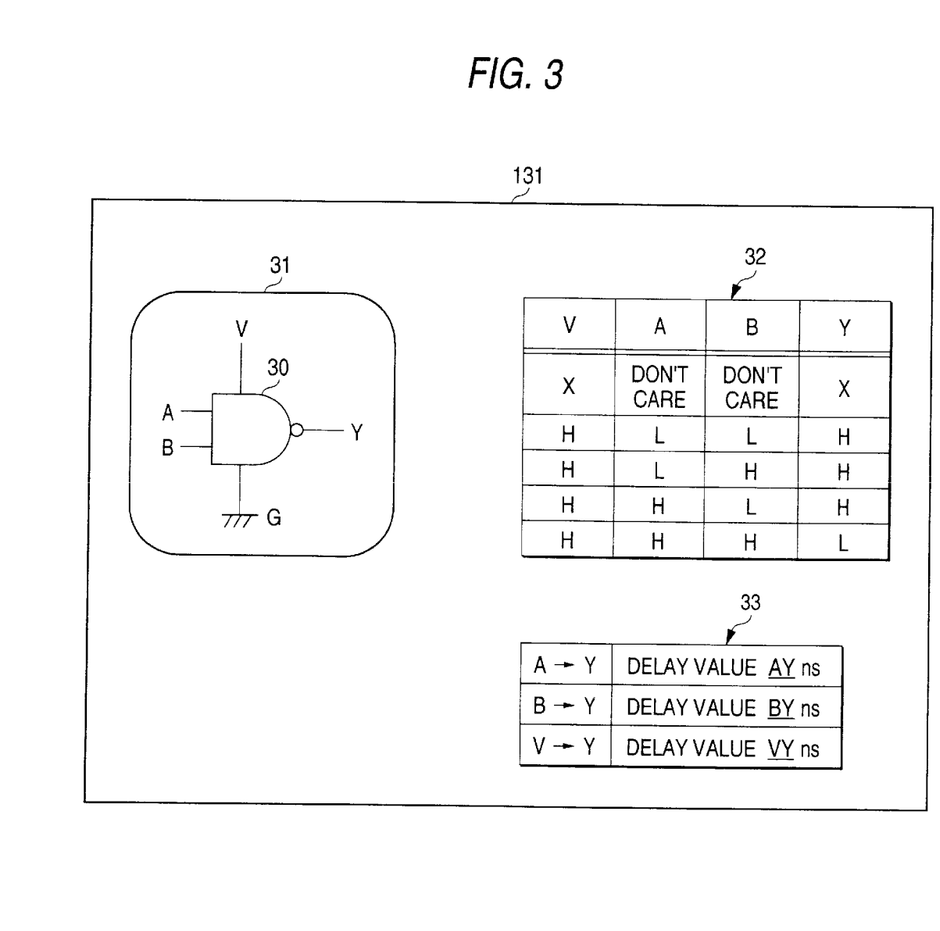
FIG. 3 is a schematic representation of the contents of a cell library database in a second embodiment of the invention.

Next, the cell library database 13 of the second embodiment used to design (logically simulate) the semiconductor integrated circuit having the circuit configuration shown in FIG. 2 by the above-described design aiding system will be discussed. FIG. 3 is a schematic representation to illustrate the contents of a symbol mark, logical information, and delay information stored in the cell library database 13 with a 2-input NAND gate 30 as a specific example of a standard cell. Entries of power consumption, inclination dependency of input waveform of delay time, etc., may be contained as information required for logical simulation in the cell library database 13. However, in the description to follow, only a symbol mark 31, a logic relation table 32, and a delay time table 33 are contained for simplicity.

In FIG. 3, numeral 31 denotes a symbol mark representing the logic of standard cell, numeral 32 denotes a logic relation table between input and output signals, and numeral 33 denotes a delay time table listing delay times until the output signal is output after the input signals change. Also as shown in the symbol mark 31, the cell library database 13 in the embodiment does not assume that power is always supplied and assumes that power is supplied from a power supply terminal V.

The logic relation table 32 is a table describing the logic of the signals also containing the power supply terminal V. For example, if the power supply terminal V is high, the NAND gate 30 operates in a similar manner to that of the conventional standard cell (see FIG. 8), namely, if both input terminals A and B are high, an output terminal Y goes low; if at least either of the input terminals A and B is low, the output terminal Y goes high. On the other hand, if the power supply terminal V by which the embodiment is characterized is "X," the output terminal Y becomes "X" because power is not supplied regardless of the logical state of the input terminal A, B.

The delay time table 33 lists the delay time until the output terminal Y changes after the input terminal A changes as AY [ns] and the delay time until the output terminal Y changes after the input terminal B changes as BY [ns], as with the conventional standard cell (see FIG. 8). In addition, the table also lists delay time VY [ns] until the output terminal Y changes from "X" to high or low after the power supply terminal V changes from "X" to high.

The cell library database 13 of the embodiment described above makes it possible to logically simulate the whole semiconductor integrated circuit having the circuit configuration illustrated in FIG. 2 including the power supply control switches 111 and 112 for controlling power supply to the first and second logical blocks 121 and 122 and the power control circuit 101 for generating the control signals ctr11 and ctr12 for controlling the switches 111 and 112 with accuracy at a time.

The cell library database 13 shown in FIG. 3 contains the logic relation table 32 having the logical information of the power supply terminal V relative to the output terminal Y and the delay time table 33 having the delay information of the power supply terminal V relative to the output terminal Y as an example; however, the logic relation table 32 may have the logical information of a ground terminal G relative to the output terminal Y and the delay time table 33 may have the delay information of the ground terminal G relative to the output terminal Y.

Figure 4:
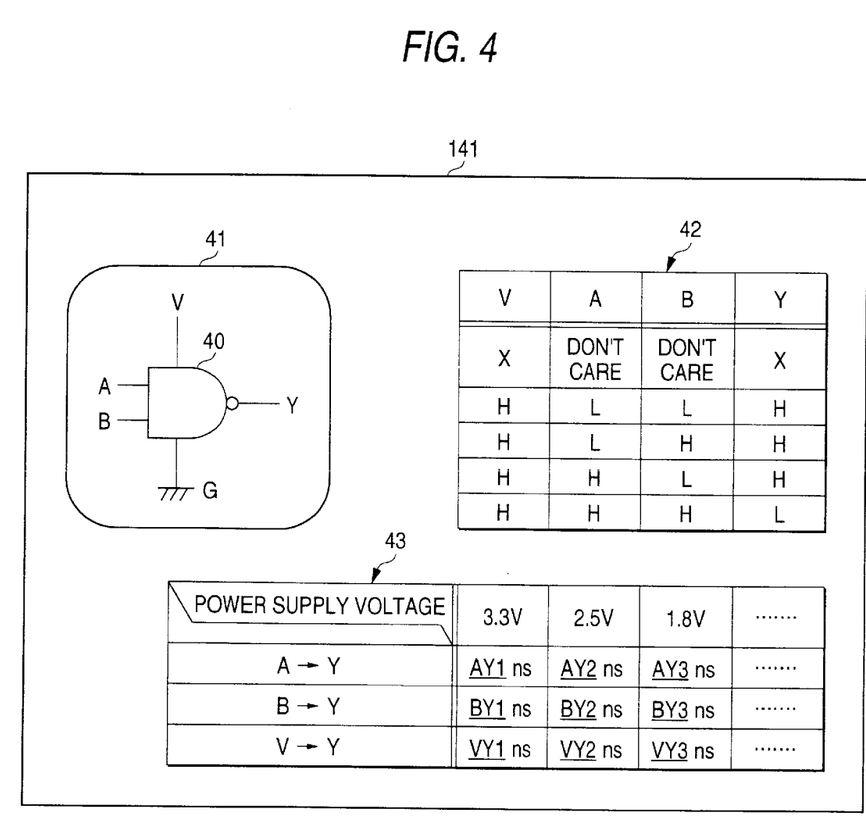
FIG. 4 is a schematic representation of the contents of the cell library database in the second embodiment of the invention.

The cell library database 13 shown in FIG. 3 contains only one limited power supply voltage to the power supply terminal V, but the delay time table may have the delay information corresponding to more than one power supply voltage. In an example shown in FIG. 4, different voltages of 3.3 [V], 2.5 [V], 1.8 [V], etc., are used as the power supply voltage to the power supply terminal V and a delay time table 43 having the delay information responsive to the multiple power supply voltages is stored.

Third Embodiment

Next, a cell library database 13 according to a third embodiment of the invention will be discussed. First, specific examples of a macro cell and a logical device to which the cell library database 13 of the embodiment is applied will be discussed, then logical information, delay information, etc., stored in the cell library database 13 will be discussed in detail.

The cell library database 13 of the embodiment has macro cells as a cell library for making it possible to logically simulate a macro cell requiring input of multiple power supplies like a level shifter used with a semiconductor integrated circuit, wherein the circuit normally operates on the precondition that each power supply is on and output of the circuit is invalid if any power supply is off.

Figure 5A:
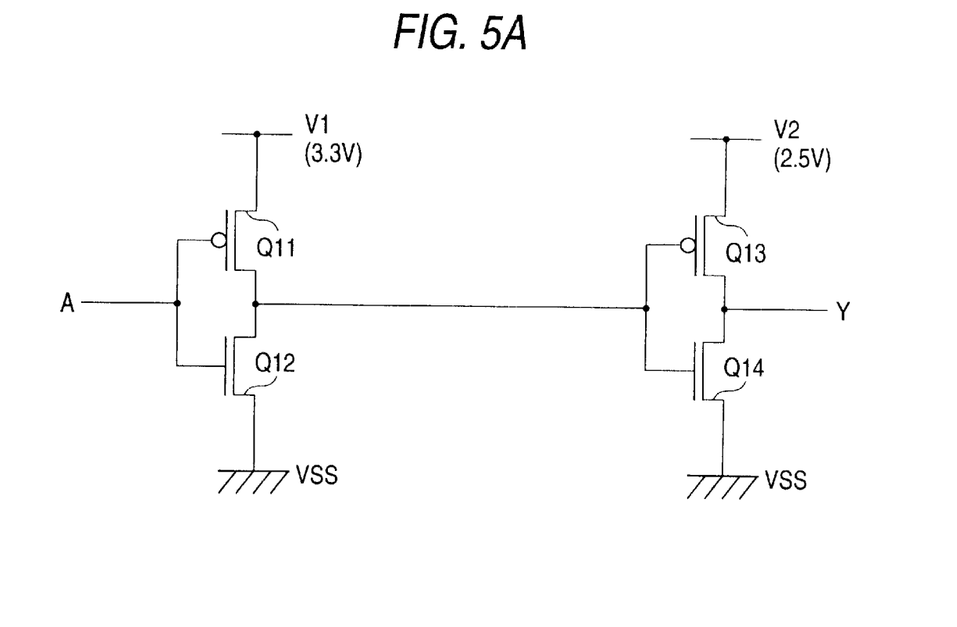
FIGS. 5A and 5B are circuit diagrams to illustrate circuit configurations of level shifters.
Figure 5B:
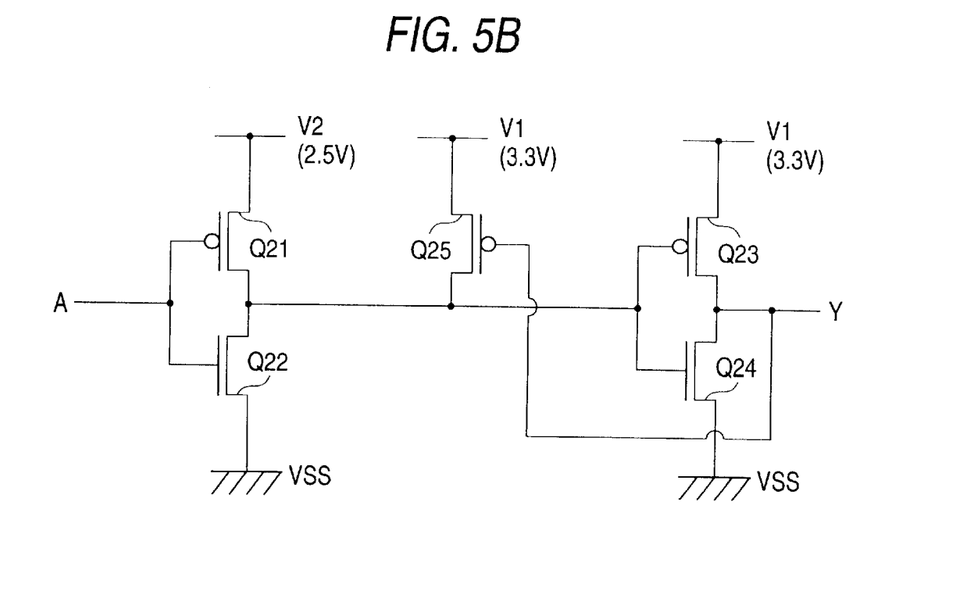

FIG. 5 is a circuit diagram to illustrate the circuit configuration of a level shifter. FIG. 5A shows a voltage decreasing circuit and FIG. 5B shows a voltage increasing circuit. That is, FIG. 5A is a circuit diagram of a level shifter for decreasing voltage from V1 (3.3 [V]) to V2 (2.5 [V]). In the figure, Q11 and Q13 denote p-channel transistors and Q12 and Q14 are n-channel transistors. FIG. 5B is a circuit diagram of a level shifter for increasing voltage from V2 (2.5 [V]) to V1 (3.3 [V]). In the figure, Q21, Q23, and Q25 denote p-channel transistors and Q22 and Q24 are n-channel transistors. Q25 denotes a pull-up transistor for providing a margin for the threshold value of each transistor in a power supply V1 series and enhancing resistance to noise. From FIGS. 5A and 5B, it is obvious that the level shifter requires power supplies V1 and V2 and normally operates on the precondition that the power supplies are on and that circuit output becomes invalid if any power supply V1 or V2 is off.

Figure 6:
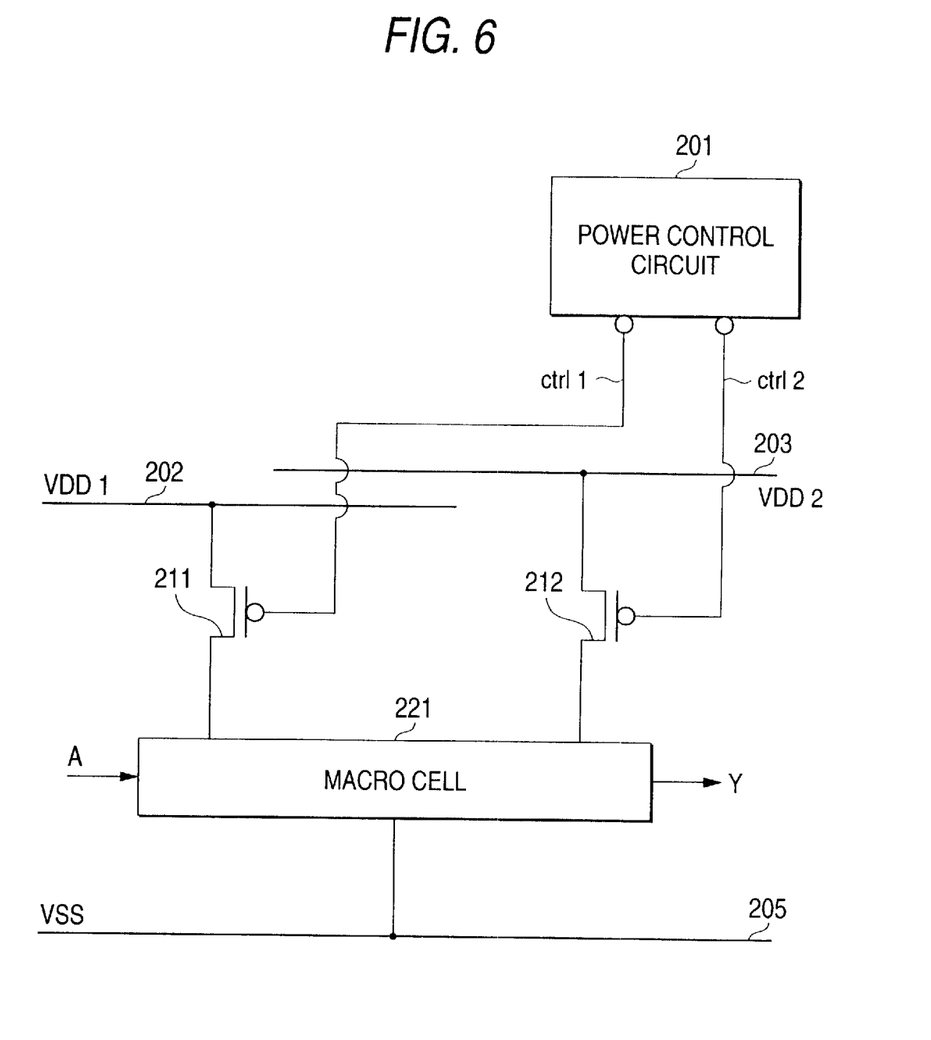
FIG. 6 is a circuit diagram to illustrate the circuit configuration using a macro cell having multiple power supplies.

FIG. 6 is a circuit diagram to show the configuration a semiconductor integrated circuit containing a macro cell having multiple power supplies, such as the above-mentioned level shifter, as a specific example of a logical device to which the cell library database 13 of the embodiment is applied.

In FIG. 6, numeral 221 denotes a macro cell having power supplies VDD1 and VDD2 installed in the semiconductor integrated circuit; it is a function element whose output Y becomes valid when the power supplies VDD1 and VDD2 are on. Numeral 201 denotes a power control circuit for generating control signals ctr11 and ctr12 for controlling power supply to the macro cell 221, numeral 202 denotes a first power supply (VDD1) line, numeral 203 denotes a second power supply (VDD2) line, and numeral 205 denotes a third power supply (VSS) line. Numerals 211 and 212 denote power supply control switches for turning on and off connection of the first power supply line 202 and the second power supply line 203 and the macro cell 221; in the circuit example, p-channel transistors are used.

For the macro cell 221 to normally operate and produce valid output, the power supply control switches 211 and 212 need to be turned on and the macro cell 221 and the first power supply line 202 and the second power supply line 203 need to be connected. This means that the control signals ctr11 and ctr12 generated by the power control circuit 201 need to be low.

Figure 7:
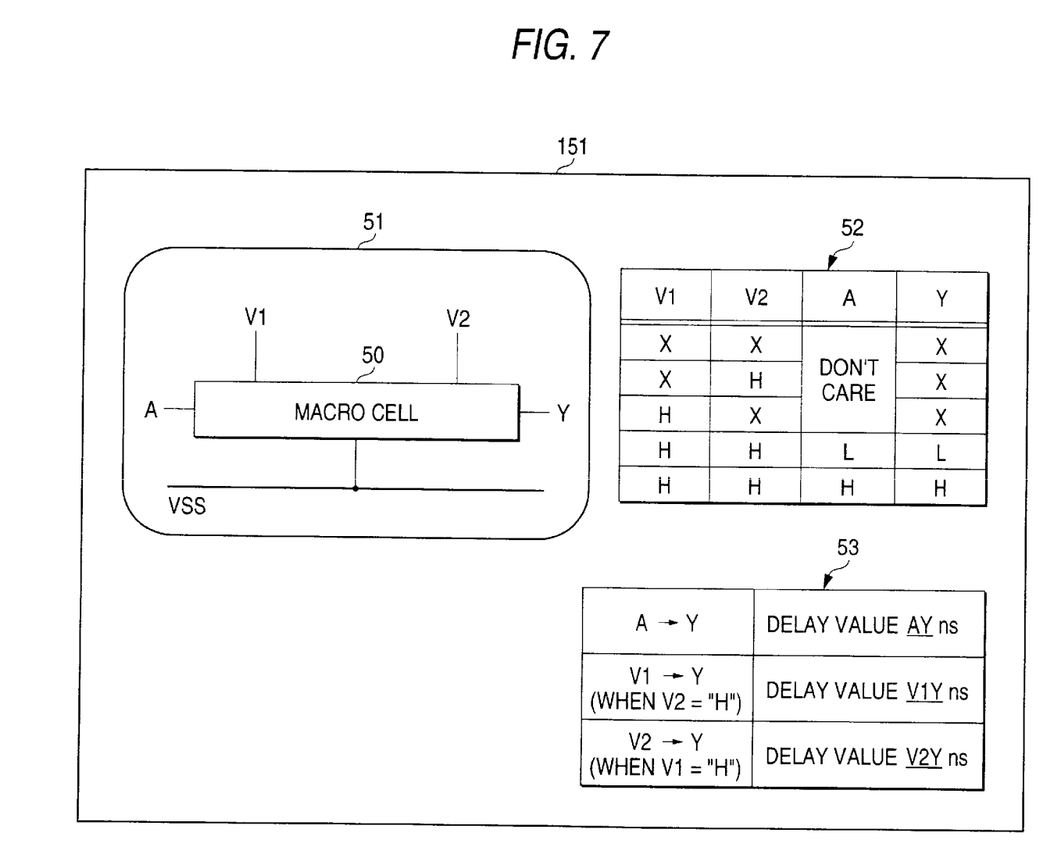
FIG. 7 is a schematic representation of the contents of a cell library database in a third embodiment of the invention.

Next, the cell library database 13 of the third embodiment required to design (logically simulate) the semiconductor integrated circuit having the circuit configuration shown in FIG. 6 by the above-described design aiding system will be discussed. FIG. 7 is a schematic representation to illustrate the contents of a symbol mark, logical information, and delay information of the macro cell stored in the cell library database 13. Entries of power consumption, inclination dependency of input waveform of delay time, etc., may be contained as information required for logical simulation in the macro cell library in the cell library database 13. However, in the description to follow, only a symbol mark 51, a logic relation table 52, and a delay time table 53 are contained for simplicity.

In FIG. 7, numeral 51 denotes a symbol mark representing a macro cell 50, numeral 52 denotes a logic relation table between input and output signals, and numeral 53 denotes a delay time table listing delay times until the output signal is output after the input signal changes. Also as shown in the symbol mark 51, the cell library database 13 in the embodiment does not assume that power is always supplied and assumes that power is supplied from multiple power supply terminals V1 and V2.

The logic relation table 52 is a table describing the logic of the signals also containing the power supply terminals V1 and V2. For example, if both the power supply terminals V1 and V2 are high, the macro cell 50 operates in a similar manner to that of the conventional macro cell, namely, outputs a valid output result in accordance with the function of the macro cell 50. On the other hand, if both or either of the power supply terminals V1 and V2 is "X," an output terminal Y becomes "X" because power is not supplied regardless of the signal of an input terminal A.

The delay time table 53 describes the delay time until the output terminal Y changes after the input terminal A changes as AY [ns], as in the related art. In addition, the table also lists delay time V1Y [ns] until the output terminal Y changes from "X" to high or low after the power supply terminal V1 changes from "X" to high when the power supply terminal V2 is high and delay time V2Y [ns] until the output terminal Y changes from "X" to high or low after the power supply terminal V2 changes from "X" to high when the power supply terminal V1 is high.

The cell library database 13 of the embodiment described above makes it possible to logically simulate the whole semiconductor integrated circuit having the circuit configuration illustrated in FIG. 6 including the power supply control switches 211 and 212 for controlling power supply to the macro cell 221 and the power control circuit 201 for generating the control signals ctr11 and ctr12 for controlling the switches 211 and 212 with accuracy at a time.

The cell library database 13 shown in FIG. 7 contains the logic relation table 52 having the logical information of the power supply terminals V1 and V2 relative to the output terminal Y and the delay time table 53 having the delay information of the power supply terminals V1 and V2 relative to the output terminal Y as an example; however, the logic relation table 52 may have the logical information of a ground terminal VSS relative to the output terminal Y and the delay time table 33 may have the delay information of the ground terminal VSS relative to the output terminal Y.

The cell library database 13 shown in FIG. 7 contains only one limited power supply voltage to the power supply terminal V1, V2, but the delay time table may have the delay information corresponding to more than one power supply voltage. In this case, as in the modified example in the second embodiment (see FIG. 4), different voltages, such as 3.3 [V], 2.5 [V], and 1.8 [V], are used as the power supply voltage to the power supply terminal V1, V2 and the delay information responsive to the multiple power supply voltages is described in the delay time table 53.

In the embodiment, the macro cell whose output becomes valid when multiple power supplies are all on has been described. However, for a macro cell whose output becomes valid if one or some of multiple power supplies are on, the logic state relationship is described in the macro cell library, whereby a similar advantage to that of the embodiment can be provided, of course.

As described above, according to the cell library database and the design aiding system of the invention, the standard cell comprises one or more power supply terminals as logical terminals, the function information of the standard cell for each type in the cell library database has the logical information or the delay information of the one or more power supply terminals relative to the output terminal, and with the design aiding system, the cell library database is used to execute logical simulation, etc. Thus, logical simulation of a logical device with multiple power supplies mixed can be executed and in addition, the whole of even a logical device comprising a control function of power supply and power supply stop for reducing power consumption can also be executed in batch; consequently, the cell library database and the design aiding system for making it possible to conduct logical simulation and design aiding accurately and easily can be provided.

According to the cell library database and the design aiding system of the invention, the macro cell comprises one or more power supply terminals as logical terminals, the function information of the macro cell for each type in the cell library database has the logical information or the delay information of the one or more power supply terminals relative to the output terminal, and with the design aiding system, the cell library database is used to execute logical simulation, etc. Thus, logical simulation of a logical device with multiple power supplies mixed can be executed and in addition, the whole of even a logical device comprising a control function of power supply and power supply stop for reducing power consumption can also be executed in batch; consequently, the cell library database and the design aiding system for making it possible to conduct logical simulation and design aiding accurately and easily can be provided.

What is claimed is:

1. A processor readable cell library database used for simulating an operation of a logical device, said cell library database comprising:

logical information of standard cells which are basic circuits forming a logical device, said standard cell including an input terminal and a power supply terminal for powering said standard cell, wherein said logical information of said standard cell treats said power supply terminal as a logical input to said standard cell such that output information of said standard cell is determined according to a state of said power supply terminal and a state of said input terminal.

2. The computer readable cell library database according to claim 1, wherein said cell library database contains delay information.

3. A processor readable cell library database used for simulating an operation of a logical device, said cell library database comprising:

logical information of macro cells which are basic circuits forming a logical device, said macro cell including an input terminal and a power supply terminal for powering said macro cell, wherein said logical information of said macro cell treats said power supply terminal as a logical input to said macro cell such that output information of said macro cell is determined according to a state of said power supply terminal and a state of said input terminal.

4. The computer readable cell library database according to claim 3, wherein said macro cell contains delay information.

5. A design aiding system for aiding design of logical devices comprising:

logical information of standard cells which are basic circuits forming a logical device, said standard cell including a power supply terminal for powering said standard cell and an input terminal, wherein said logical information of said standard cell treats said power supply terminal as a logical input to said standard cell such that output information of said standard cell is determined according to a state of said power supply terminal and a state of said input terminal.

6. A design aiding system for aiding design of logical devices according to claim 5, wherein said cell library database contains delay information.

7. A design aiding system for aiding design of logical devices comprising:

logical information of macro cells which are basic circuits forming a logical device, said macro cell including an input terminal and a power supply terminal for powering said macro cell, wherein said logical information of said macro cell treats said power supply terminal as a logical input to said macro cell such that output information of said macro cell is determined according to a state of said power supply terminal and a state of said input terminal.

8. A design aiding system for aiding design of logical devices according to claim 7, wherein said macro cell contains delay information.

9. A processor readable cell library database used for determining an operation of a logical device, said cell library database comprising:

functional descriptions of standard cells, each standard cell being a basic circuit included in the logical device, said standard cell including a power supply terminal for powering said standard cell, wherein said functional description of said standard cell treats said power supply terminal as a logical input to said standard cell such that output information of said standard cell is determined according to a state of said power supply terminal.

10. The computer readable cell library database according to claim 9, wherein said output information includes state information.

11. The computer readable cell library database according to claim 9, wherein said output information includes time delay information.

12. A processor readable cell library database used for determining an operation of a logical device, said cell library database comprising:

functional descriptions of macro cells, each macro cell being a functional circuit included in the logical device, said macro cell including a power supply terminal for powering said macro cell, wherein said functional description of said macro cell treats said power supply terminal as a logical input to said macro cell such that output information of said macro cell is determined according to a state of said power supply terminal.

13. The computer readable macro cell library database according to claim 12, wherein said output information includes state information.

14. The computer readable macro cell library database according to claim 12, wherein said output information includes time delay information.

15. A method for simulating an operation of a logic circuit, said method including the steps of:

representing the logic circuit as a collection of standard cells, wherein functional information about each standard cell is stored in a computer database, said functional information including information about an output of said standard cell depending on a state of a power supply input to said standard cell;

executing said simulation to simulate the operation of said logic circuit.

16. The method according to claim 15, wherein said functional information about said standard cell includes state information about said output depending on said state of said power supply input.

17. The method according to claim 15, wherein said functional information about said standard cell includes time delay information about said output depending on said state of said power supply input.

18. The method of claim 17 wherein said state of said power supply input is a voltage level of said power supply input.

19. A device for simulating an operation of a logic circuit, said device comprising:

means for representing the logic circuit as a collection of standard cells, wherein functional information about each standard cell is stored in a computer database, said functional information including information about an output of said each standard cell depending on a state of a power supply input to said standard cell;

means for executing said simulation on a computer to simulate the operation of said logic circuit.

20. The device according to claim 19, wherein said functional information about said standard cell includes state information about said output depending on said state of said power supply input.

21. The device according to claim 19, wherein said functional information about said standard cell includes time delay information about said output depending on said state of said power supply input.

22. The device according to claim 21 wherein said state of said power supply input is a voltage level of said power supply input.

* * * * *

UNITED STATES PATENT AND TRADEMARK OFFICE
CERTIFICATE OF CORRECTION

PATENT NO. : 6,490,715 B1
DATED : December 3, 2002
INVENTOR(S) : Toshiyuki Moriwaki et al.

It is certified that error appears in the above-identified patent and that said Letters Patent is hereby corrected as shown below:

<u>Title page, Item [54] and Column 1, lines 1 and 2,</u>
Please delete "CELL LIBRARY DATABASE AND DESIGN AIDING SYSTEM", and insert therefor -- COMPUTER AIDED DESIGN METHOD USING CELL LIBRARY DATABASE FOR POWER REDUCED CIRCUIT DESIGN --.

<u>Column 4,</u>
Line 29, please delete "b e", and insert therefor -- be --.

Signed and Sealed this twenty-ninth Day of April, 2003

JAMES E. ROGAN
*Director of the United States Patent and Trademark Office*